United States Patent
Rolston et al.

(10) Patent No.: US 7,178,235 B2
(45) Date of Patent: Feb. 20, 2007

(54) METHOD OF MANUFACTURING AN OPTOELECTRONIC PACKAGE

(75) Inventors: David Robert Cameron Rolston, Beaconsfield (CA); Tomasz Maj, Montreal (CA)

(73) Assignee: Reflex Photonics Inc., Montréal (CA)

( * ) Notice: Subject to any disclaimer, the term of this patent is extended or adjusted under 35 U.S.C. 154(b) by 424 days.

(21) Appl. No.: 10/725,566

(22) Filed: Dec. 3, 2003

(65) Prior Publication Data

US 2005/0121820 A1 Jun. 9, 2005

(51) Int. Cl.
*H01R 43/02* (2006.01)
(52) U.S. Cl. .............................. 29/860; 29/846; 29/848; 29/850; 29/855; 29/856; 29/862; 156/209; 156/307.1; 174/522; 257/793; 264/162; 264/272.15; 264/272.17; 385/51; 385/94
(58) Field of Classification Search .................. 29/860, 29/846, 848, 850, 855, 856, 832; 174/52.2; 257/793; 264/162, 272.15, 272.17; 385/51, 385/94; 156/209, 307.1
See application file for complete search history.

(56) References Cited

U.S. PATENT DOCUMENTS

| | | | | |
|---|---|---|---|---|
| 5,107,327 | A | * | 4/1992 | Nishimori et al. .......... 257/793 |
| 5,791,973 | A | * | 8/1998 | Nishio .......................... 451/41 |
| 5,960,141 | A | | 9/1999 | Sasaki et al. |
| 6,054,716 | A | | 4/2000 | Sonobe et al. |
| 6,170,996 | B1 | * | 1/2001 | Miura et al. .................. 385/94 |
| 6,629,209 | B1 | | 9/2003 | Arimilli et al. |
| 2002/0001869 | A1 | | 1/2002 | Fjelstad |
| 2002/0181899 | A1 | | 12/2002 | Tartaglia et al. |
| 2004/0114859 | A1 | | 6/2004 | Colgan et al. |

FOREIGN PATENT DOCUMENTS

EP    0466950    7/1998

\* cited by examiner

*Primary Examiner*—A. Dexter Tugbang
*Assistant Examiner*—Tim Phan
(74) *Attorney, Agent, or Firm*—Ogilvy Renault, LLP

(57) ABSTRACT

A method for providing an encapsulated optoelectronic chip is provided. The optoelectronic chip is secured on a substrate. A translucent coating substance is then applied on said optoelectronic chip and the translucent coating substance is then polished away to enable an optical coupling.

17 Claims, 22 Drawing Sheets

Transparent Epoxy over Optoelectronic Chip (Perspective)

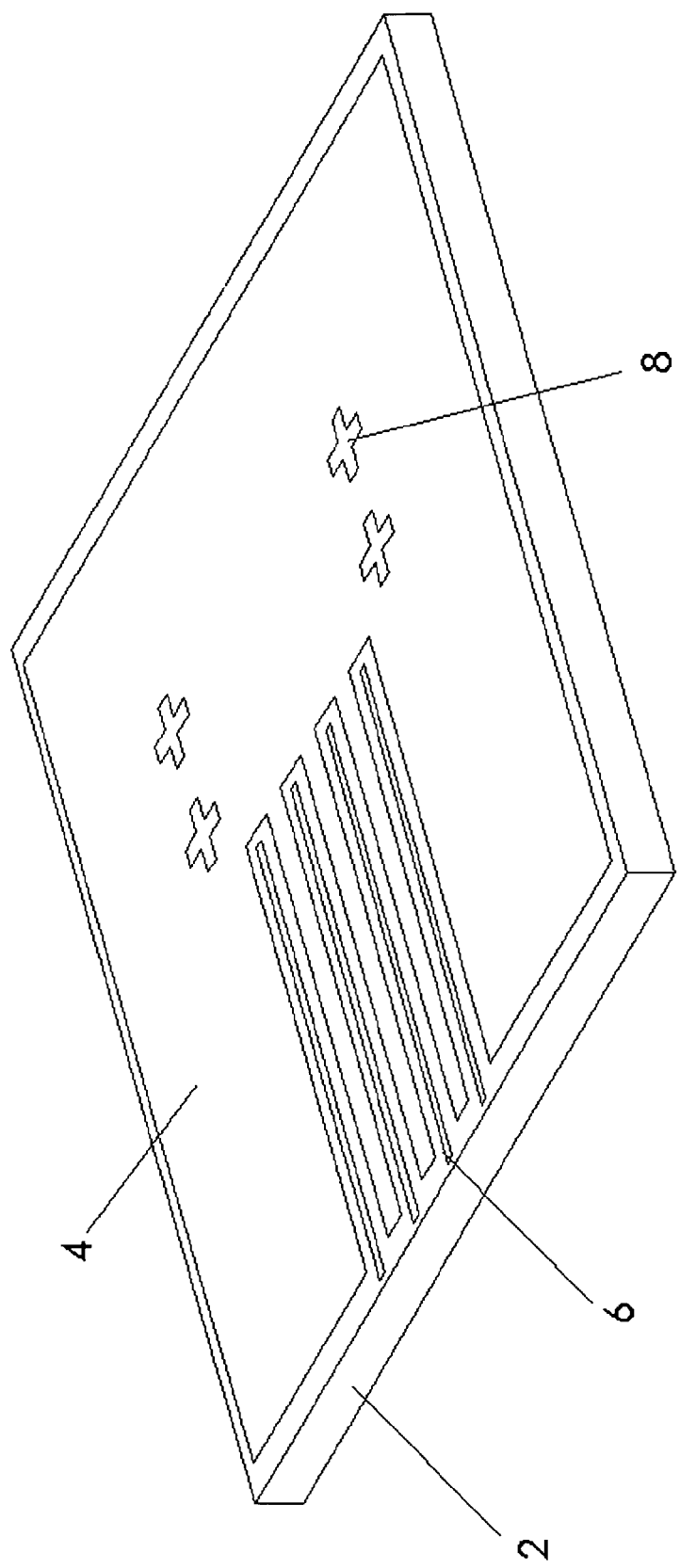
Figure 01a - Ceramic Chip Carrier (Perspective)

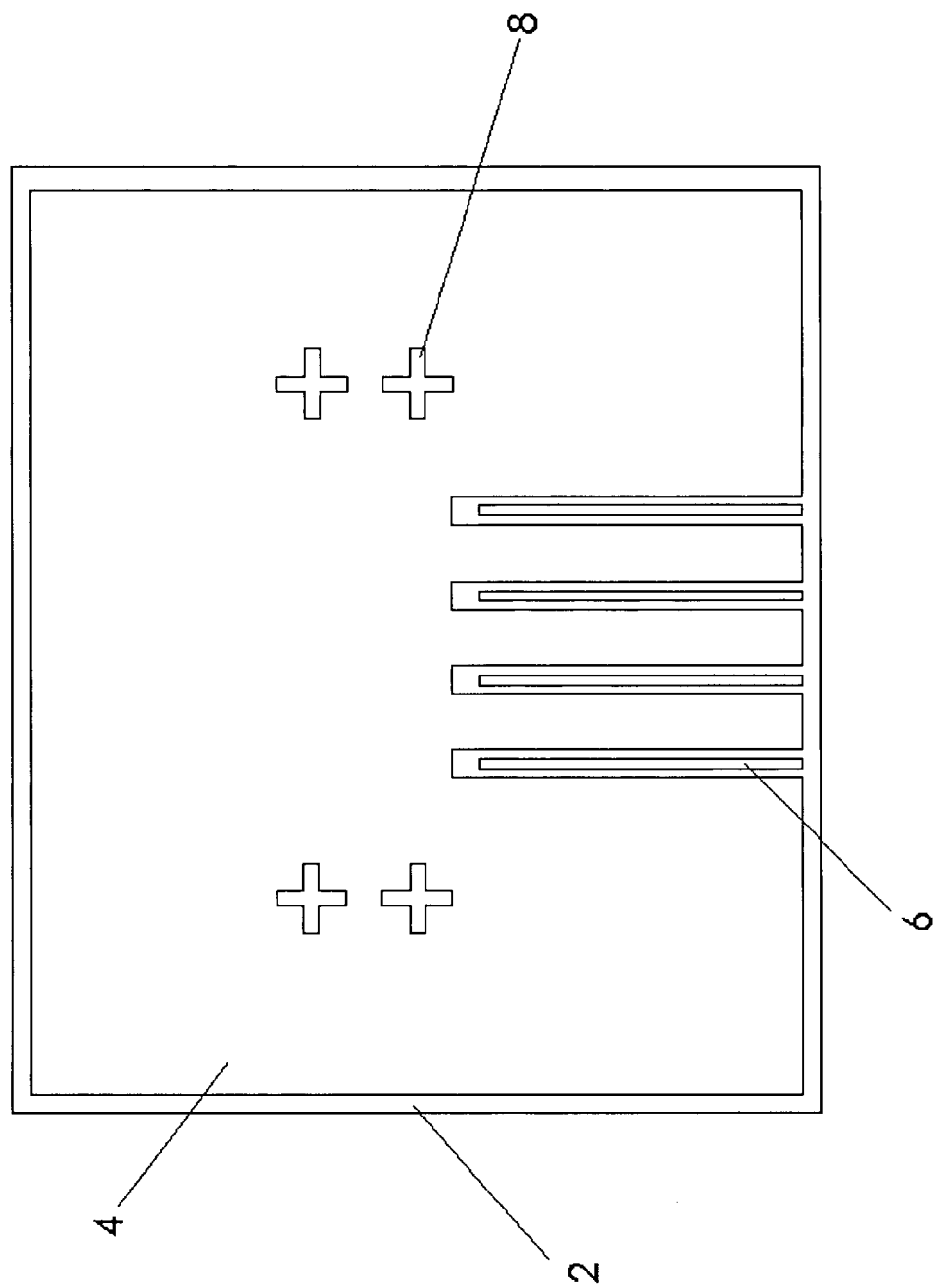
Figure 01b - Ceramic Chip Carrier (Top)

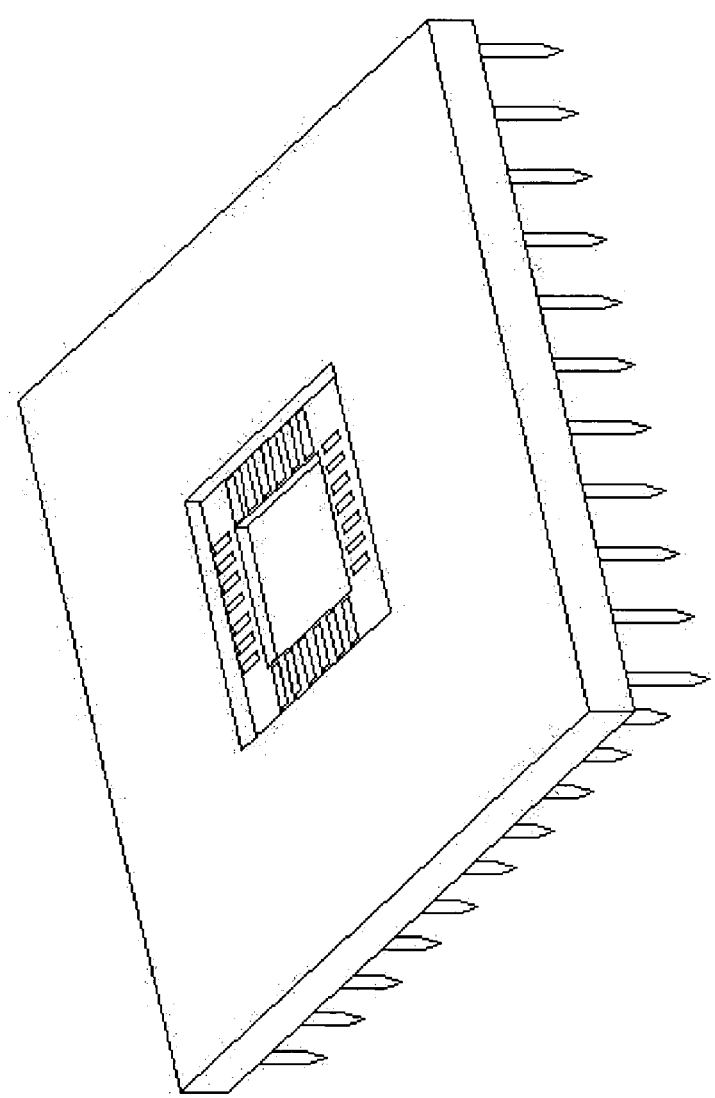
Figure 01c - Standard Pin Grid Array (PGA) (Perspective)

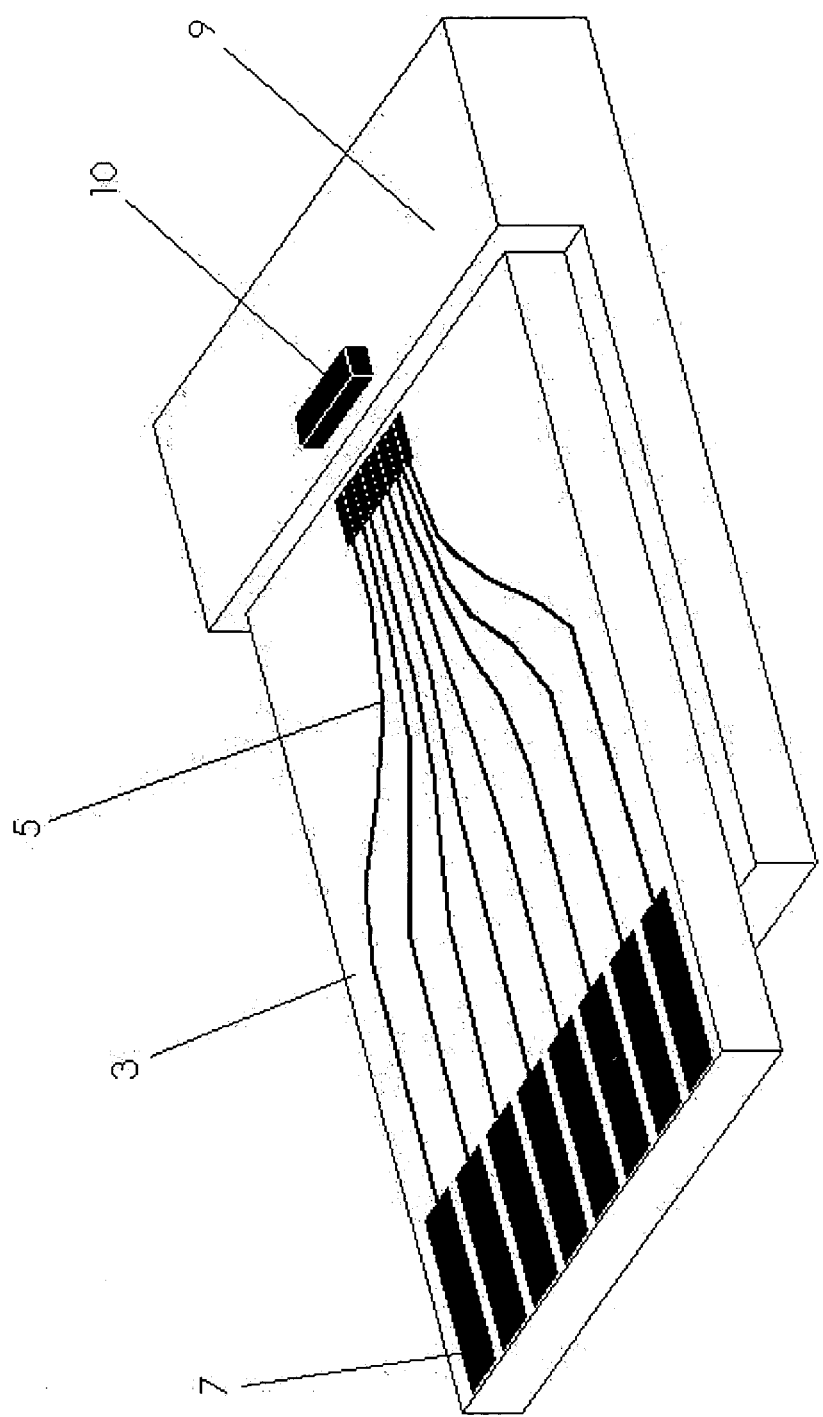
Figure 01d – Custom PCB Package (Perspective)

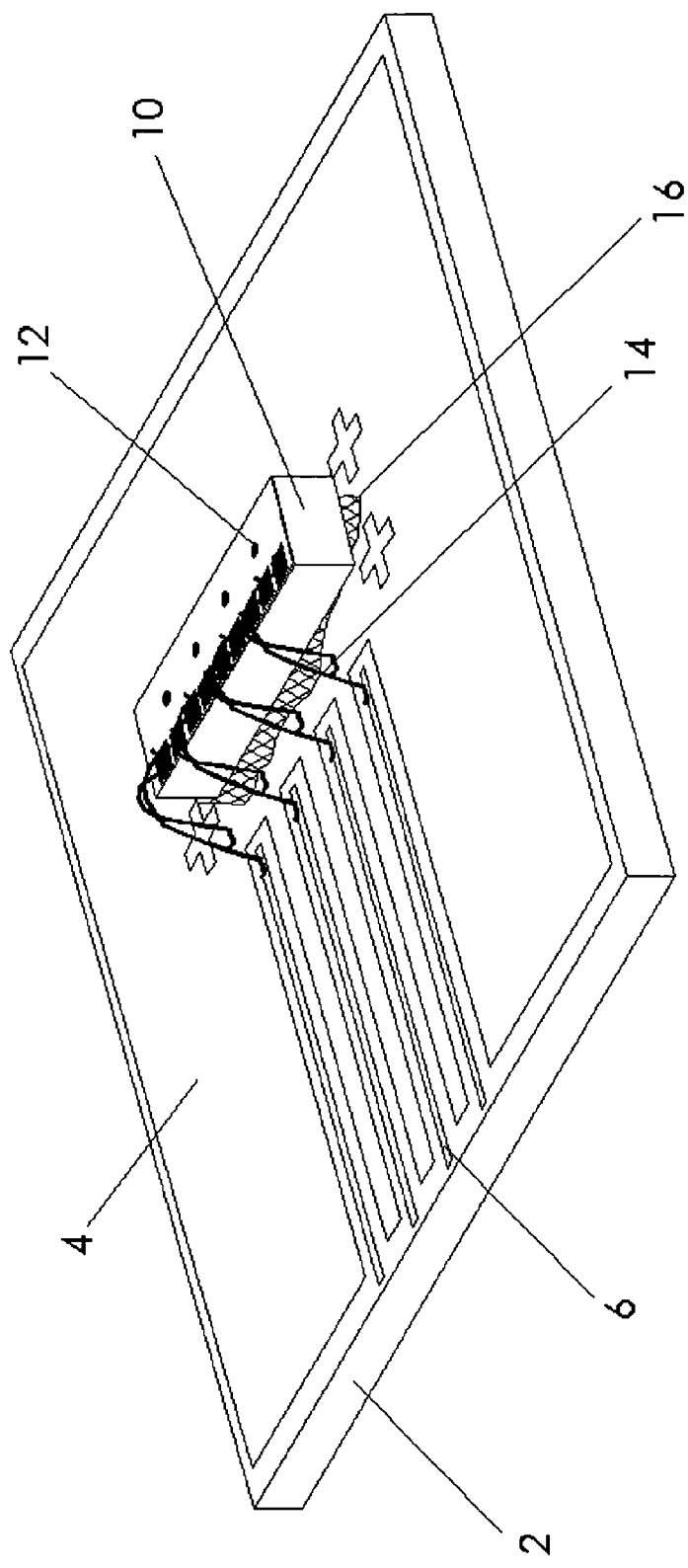
Figure 02a - Optoelectronic Chip Epoxied and Wirebonded to Carrier (Perspective)

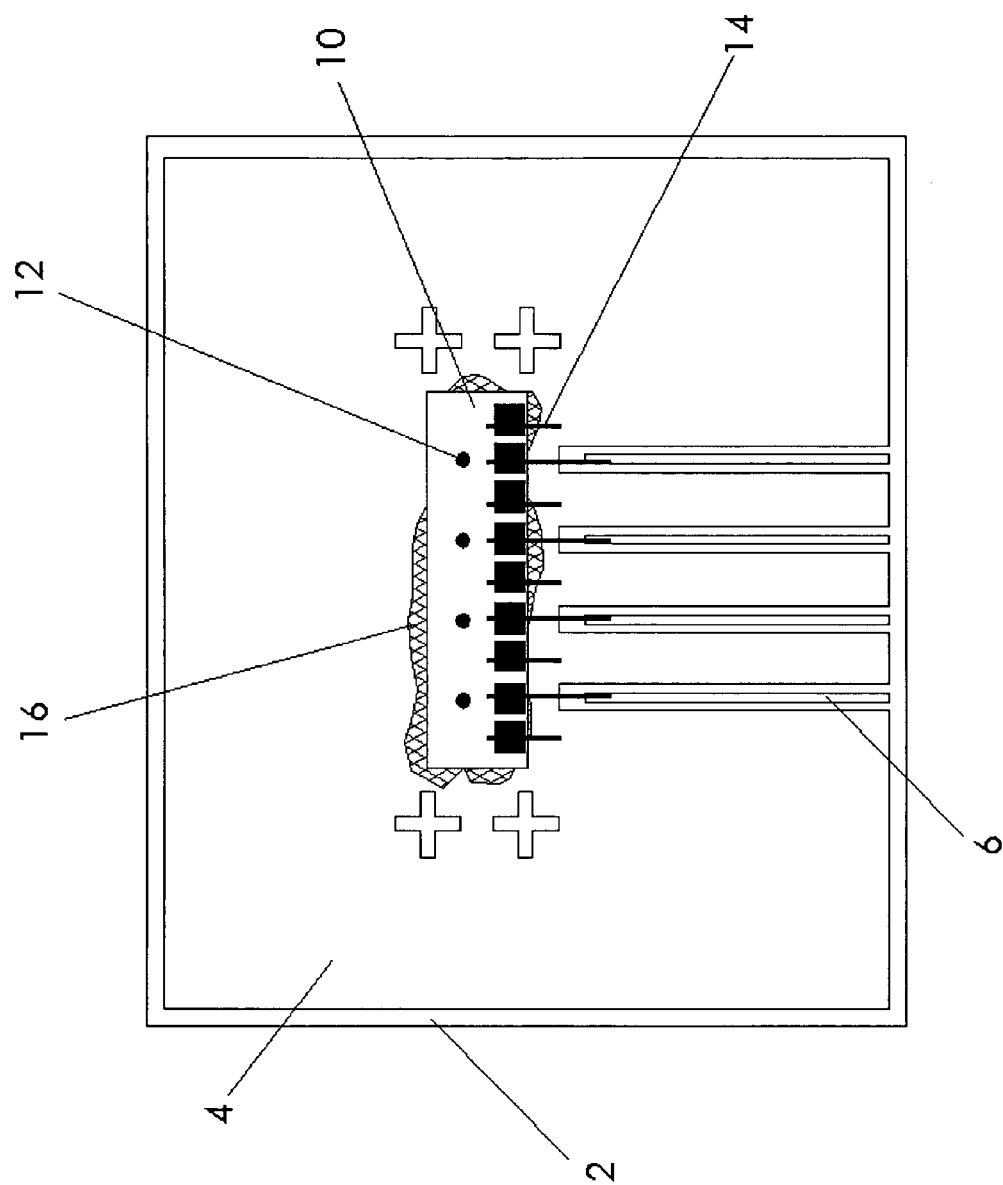
Figure 02b - Optoelectronic Chip Epoxied and Wirebonded to Carrier (Top)

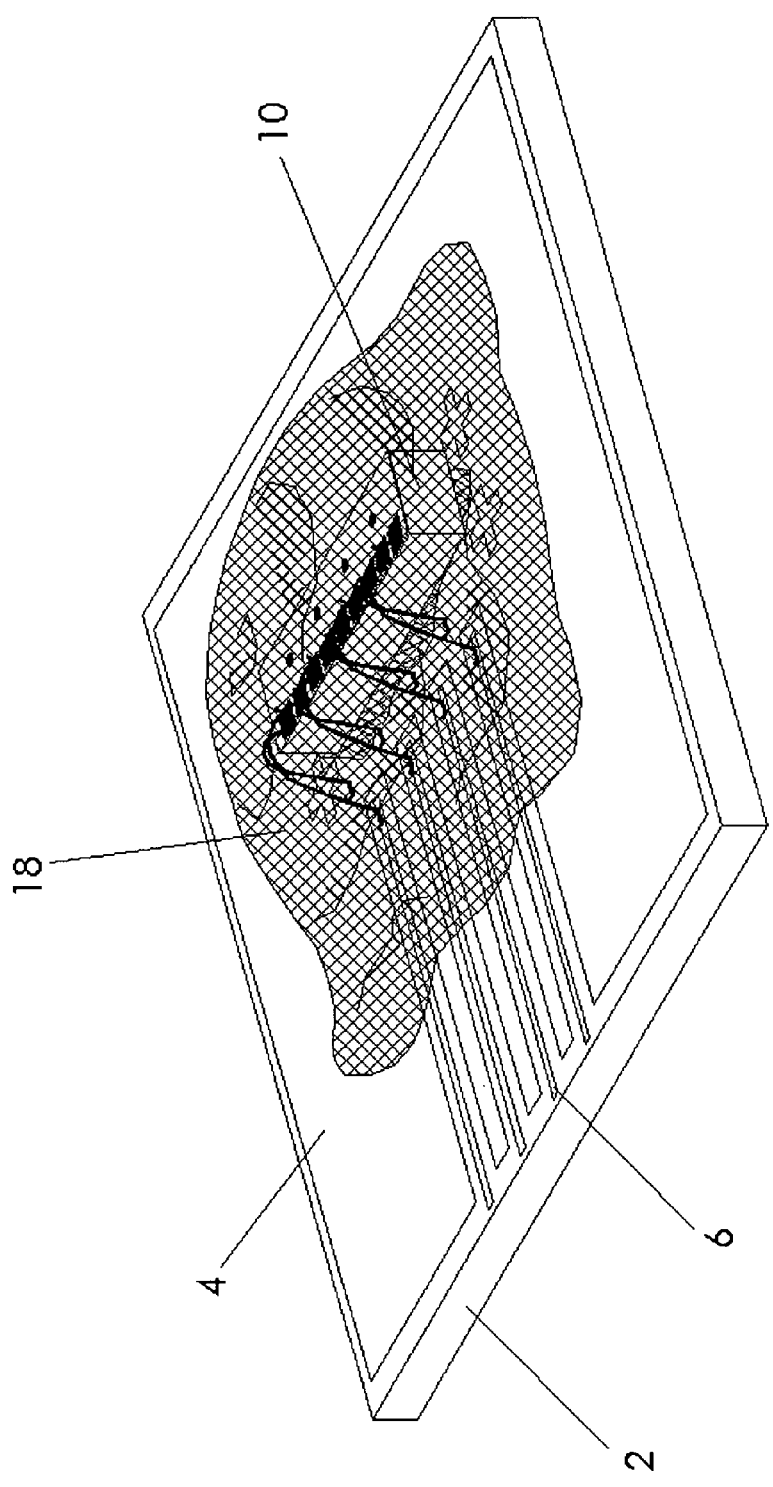
Figure 03a - Bump of Transparent Epoxy over Optoelectronic Chip (Perspective)

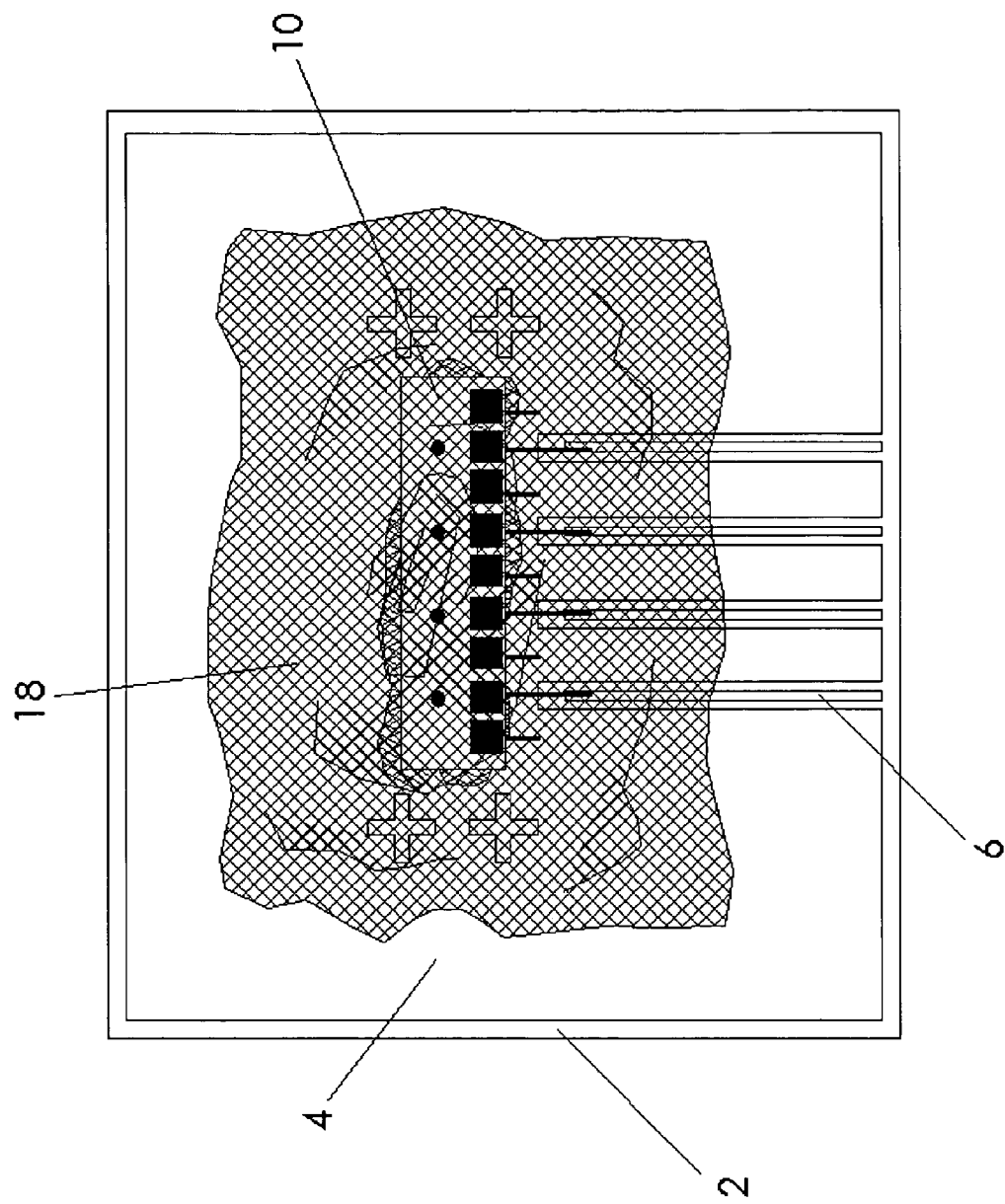
Figure 03b - Bump of Transparent Epoxy over Optoelectronic Chip (Top)

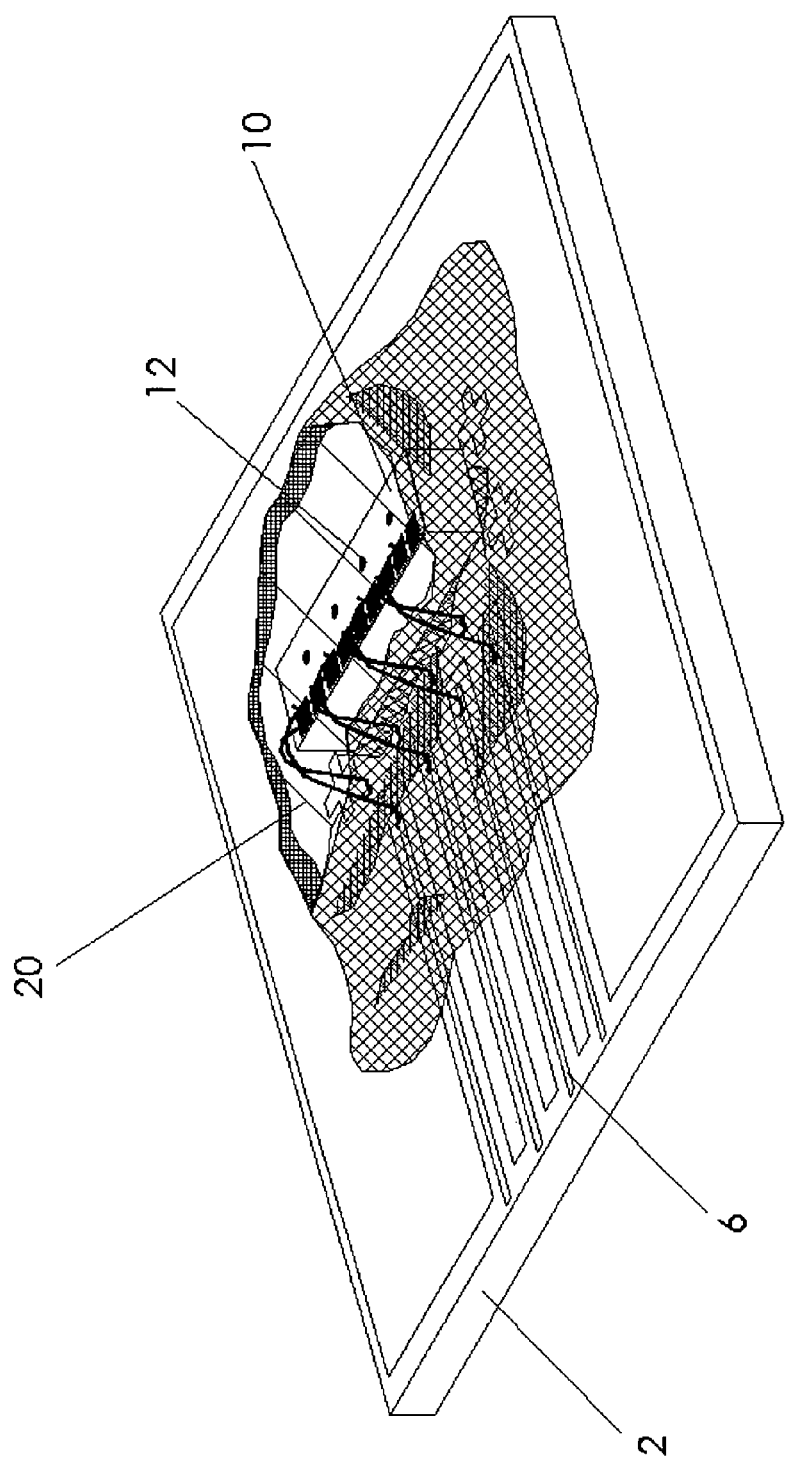
Figure 04a – Flat Polished Transparent Epoxy (Perspective)

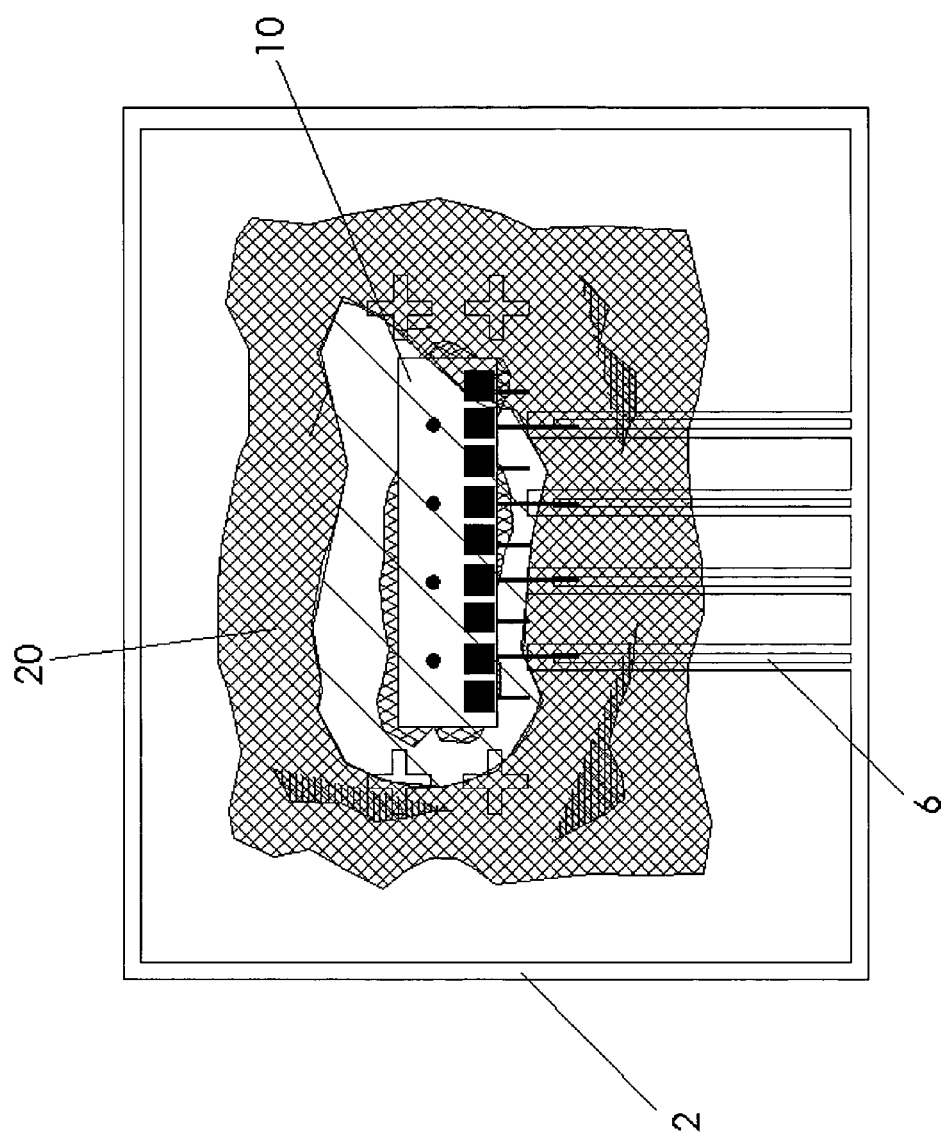
Figure 04b - Flat Polished Transparent Epoxy (Top)

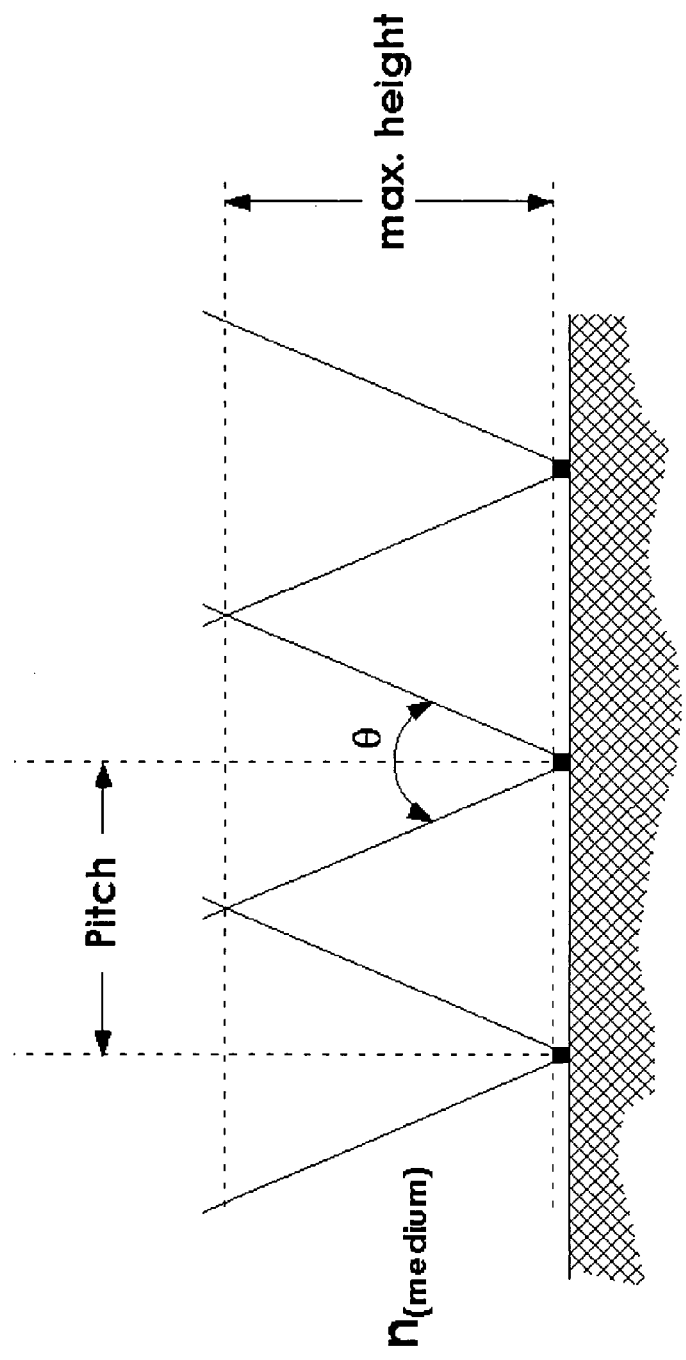
Figure 05 - Geometry for Divergence of Laser to determine Thickness

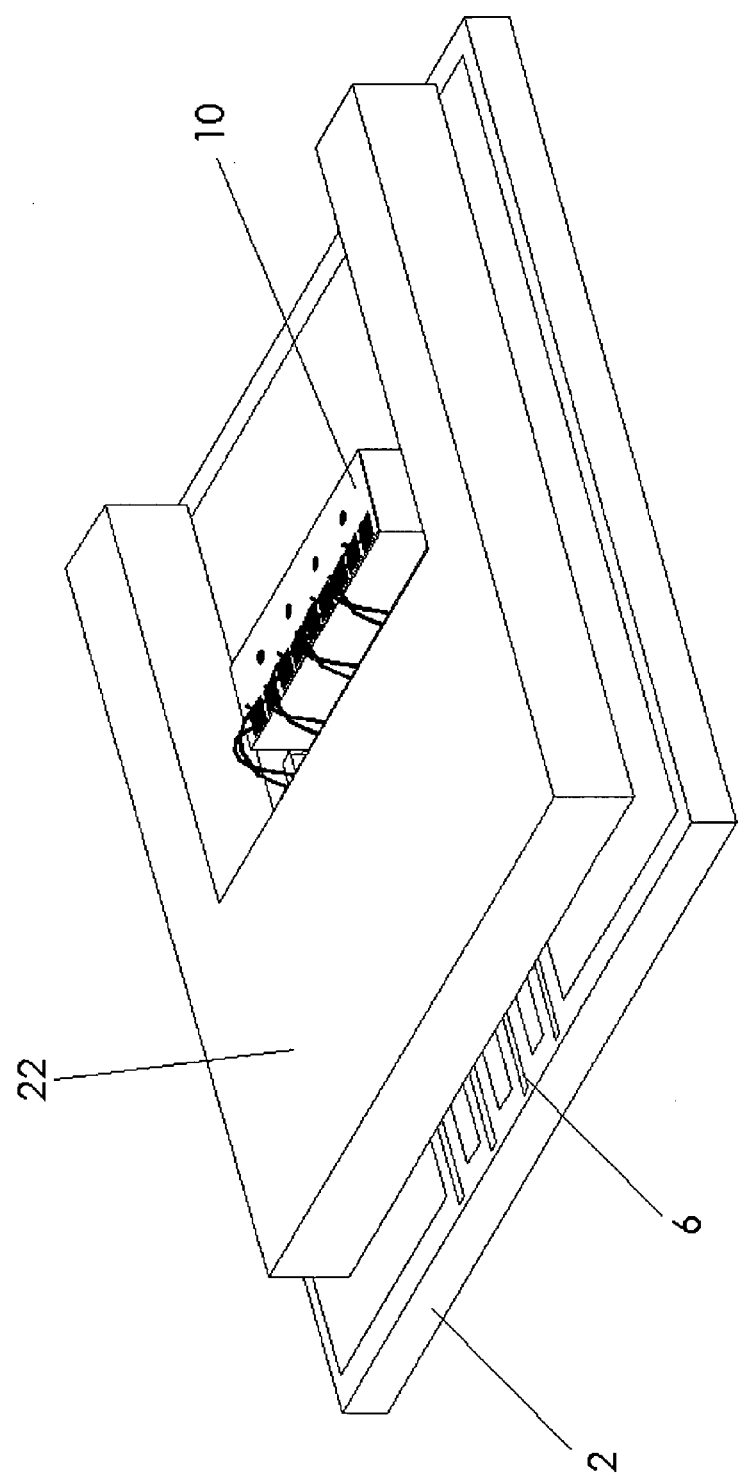
Figure 06a - Optoelectronic Chip and Carrier with Spacer Plate (Perspective)

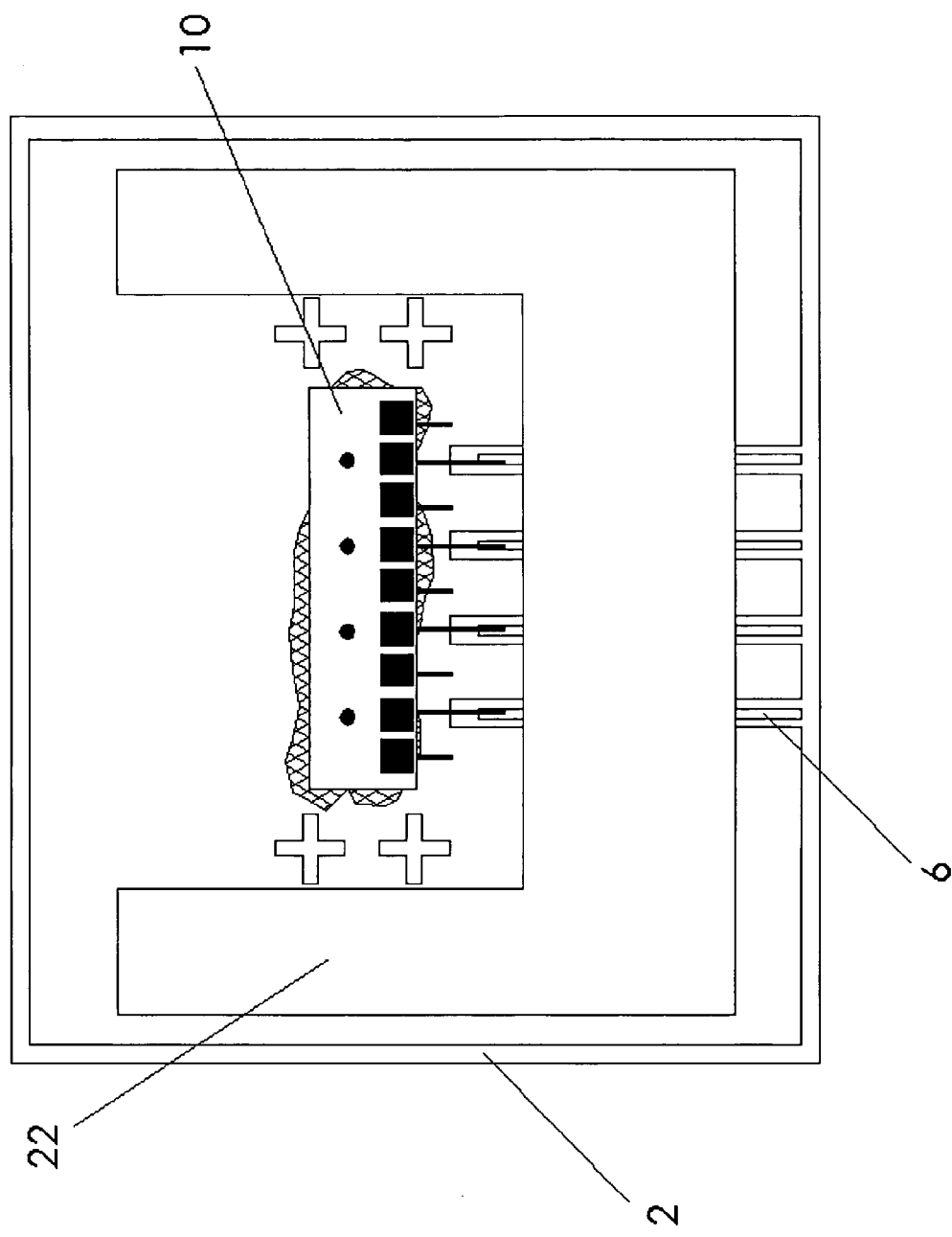
Figure 06b - Optoelectronic Chip and Carrier with Spacer Plate (Top)

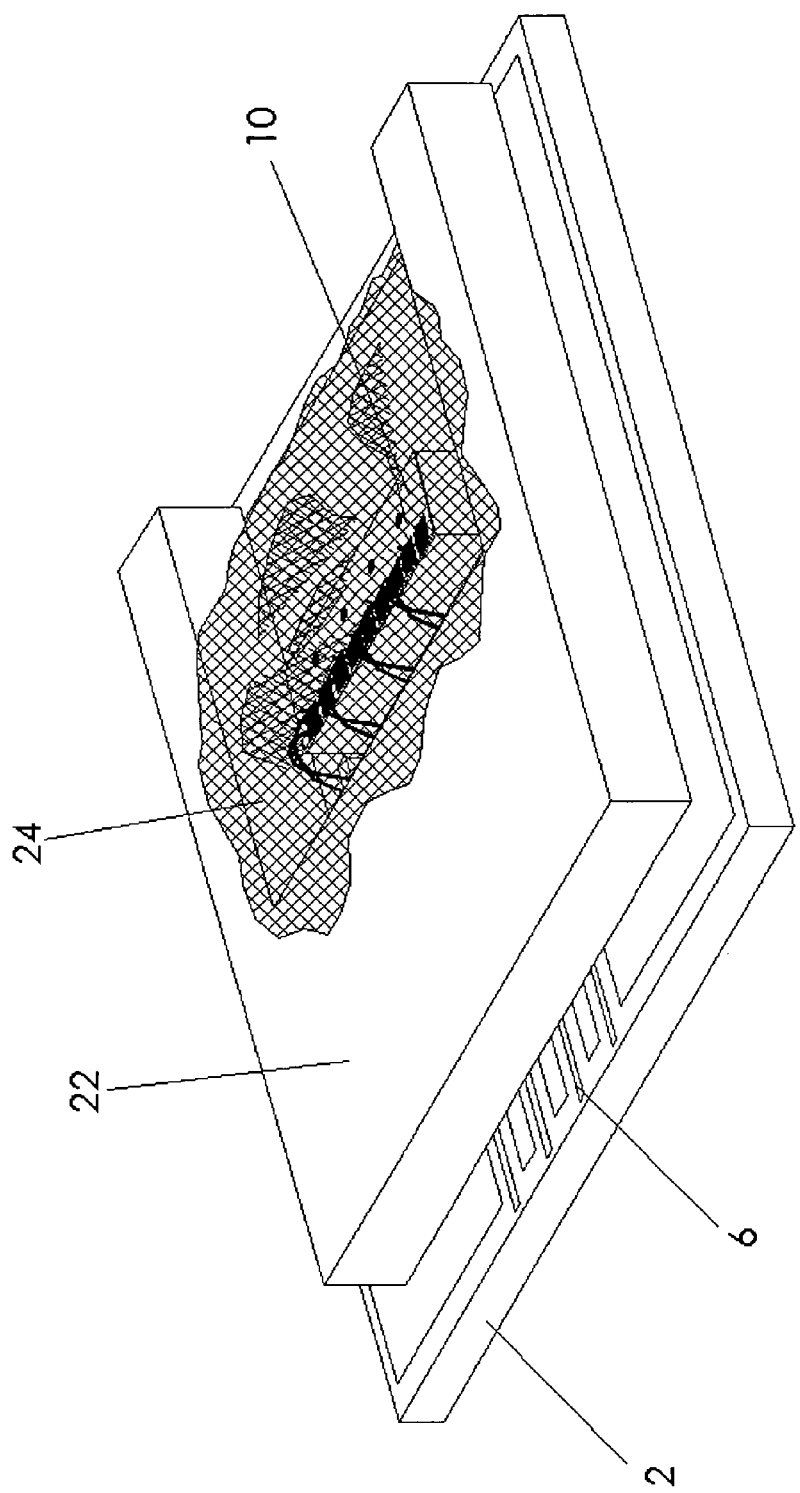
Figure 07a - Transparent Epoxy over Optoelectronic Chip (Perspective)

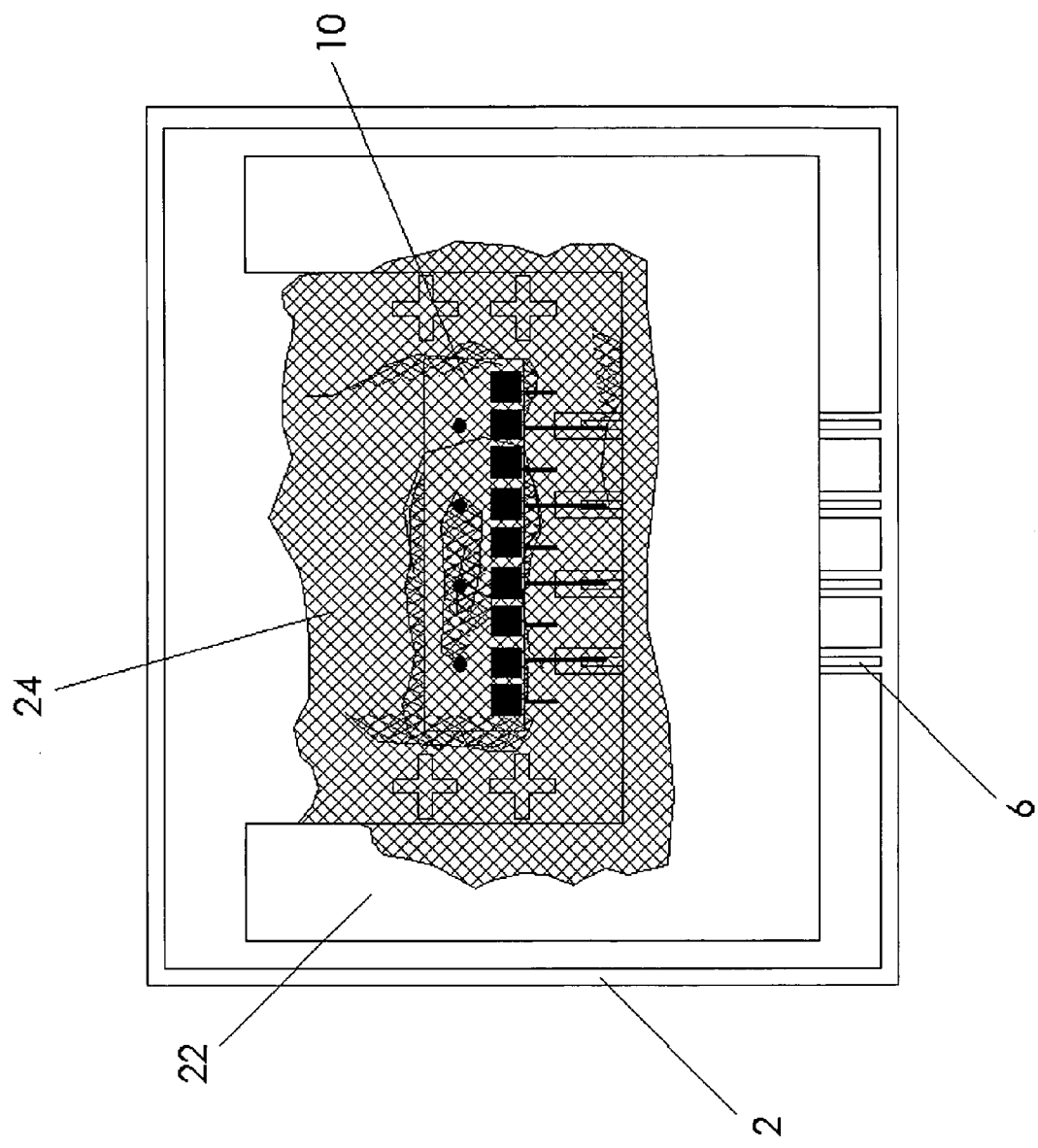
Figure 07b - Transparent Epoxy over Optoelectronic Chip (Top)

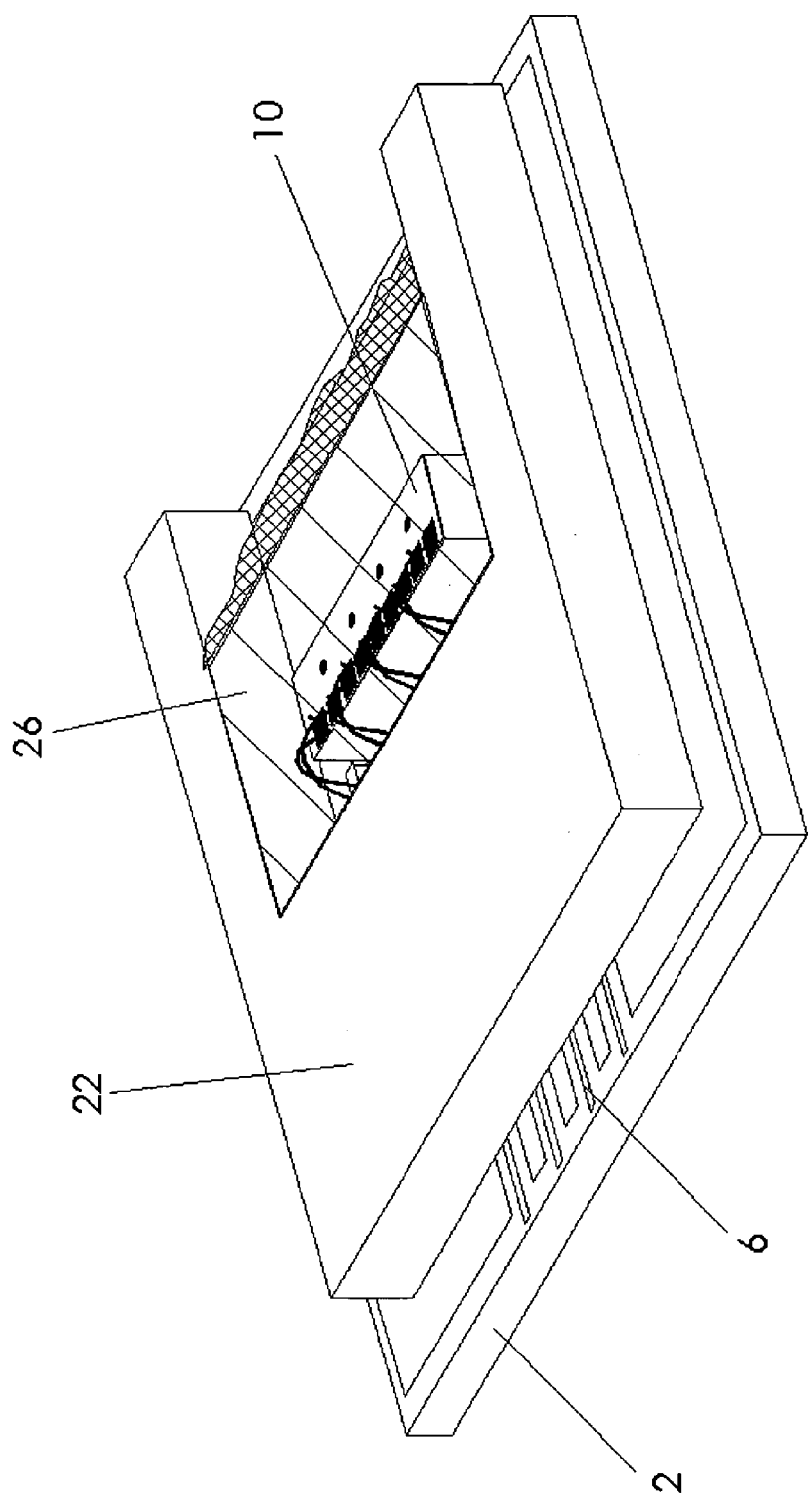
Figure 08a – Flat Polish of the Transparent Epoxy (Perspective)

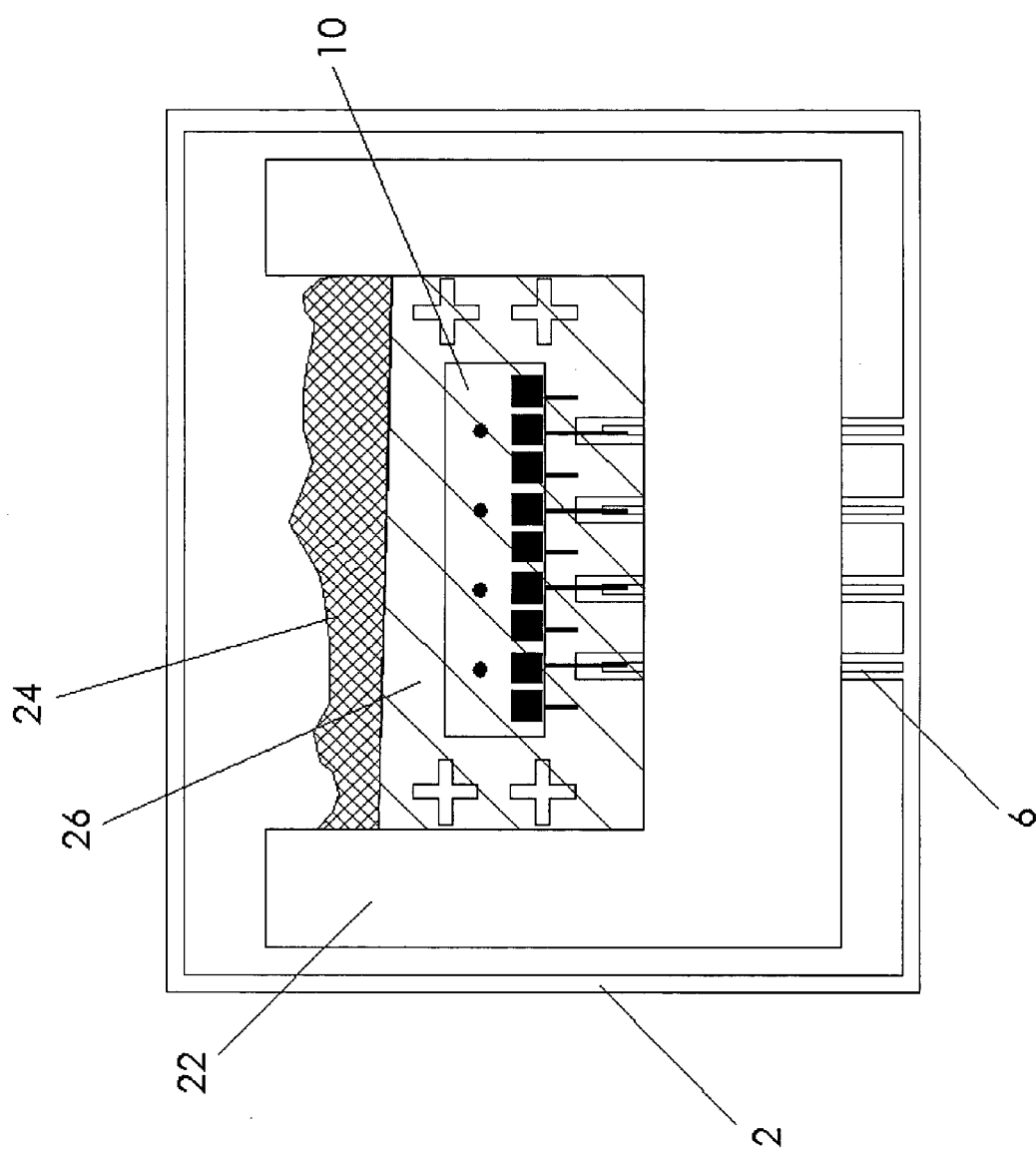
Figure 08b - Flat Polish of the Transparent Epoxy (Top)

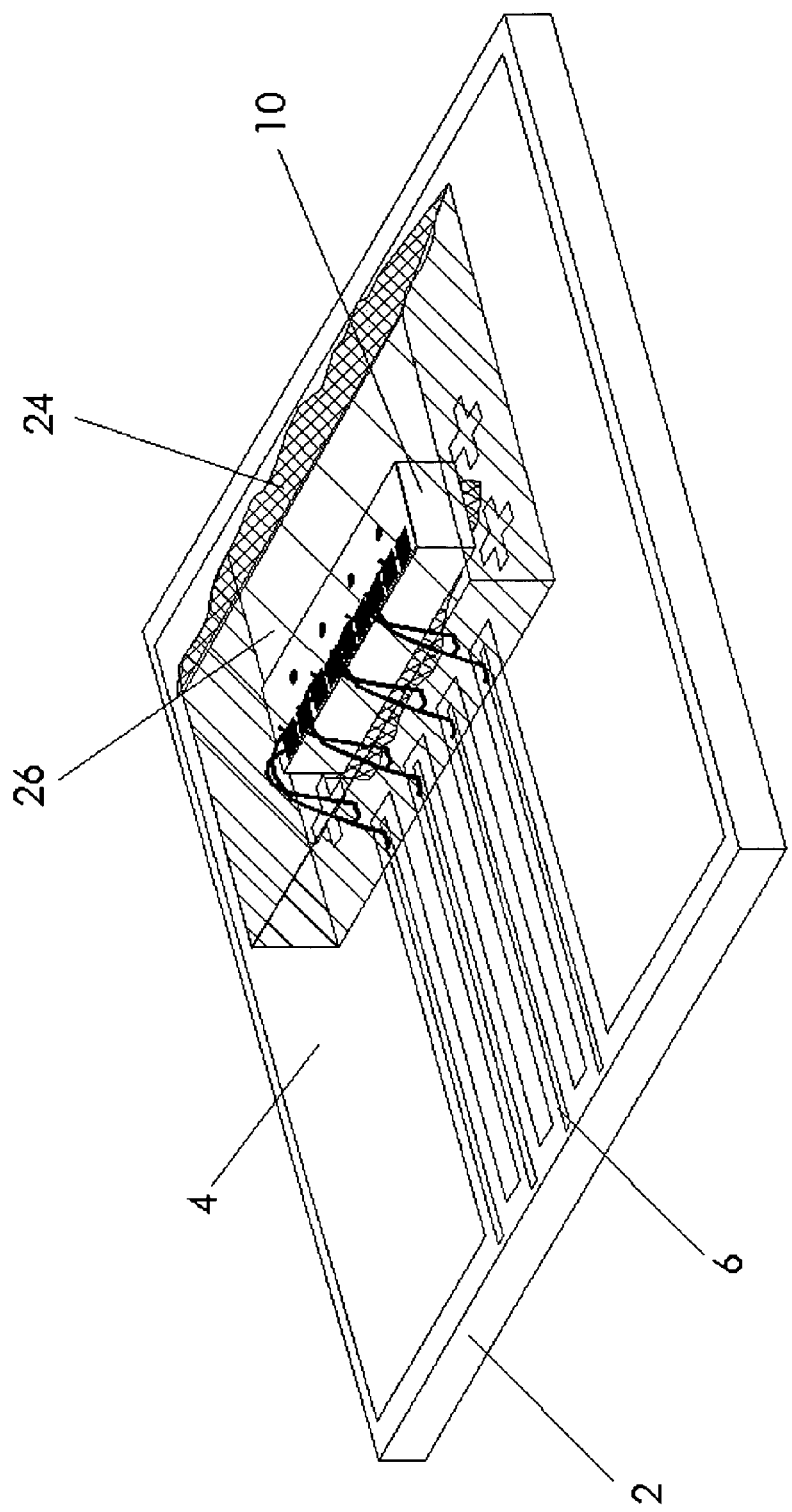
Figure 09a – Optional Removal of Spacer Plate (Perspective)

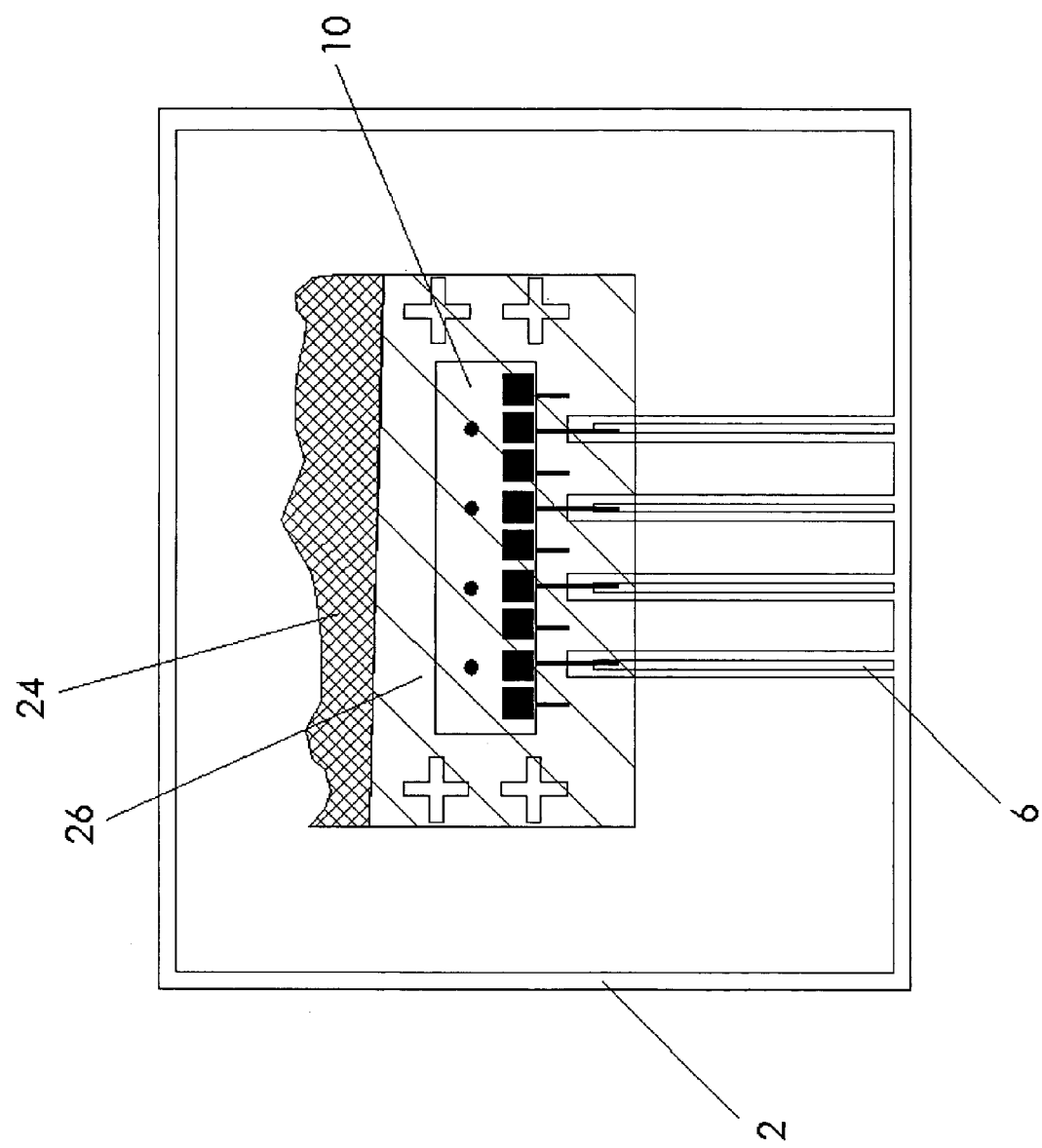
Figure 09b - Optional Removal of Spacer Plate (Top)

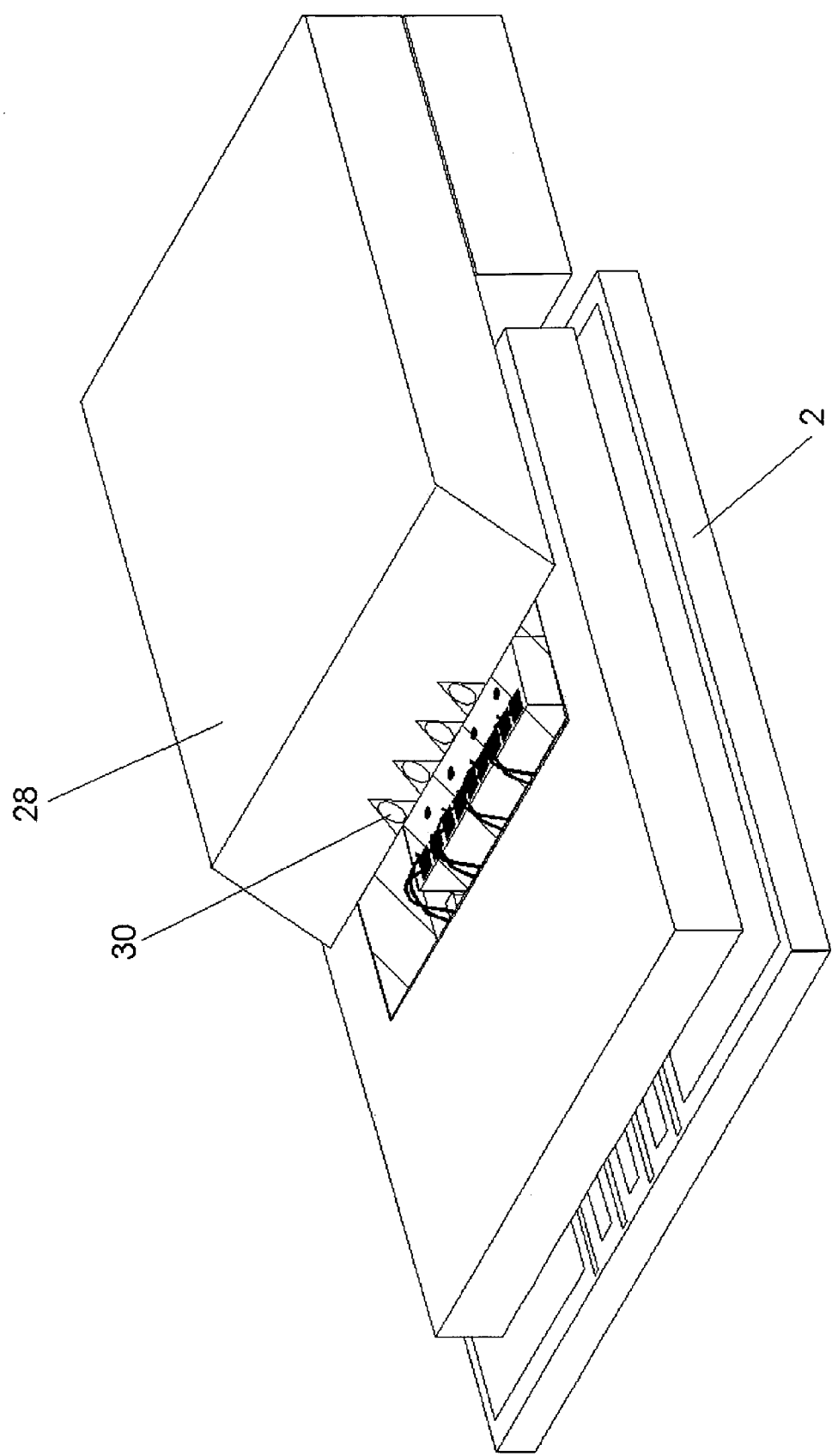
Figure 10a - Optical Ferrule aligned to Optoelectronic Device (Perspective)

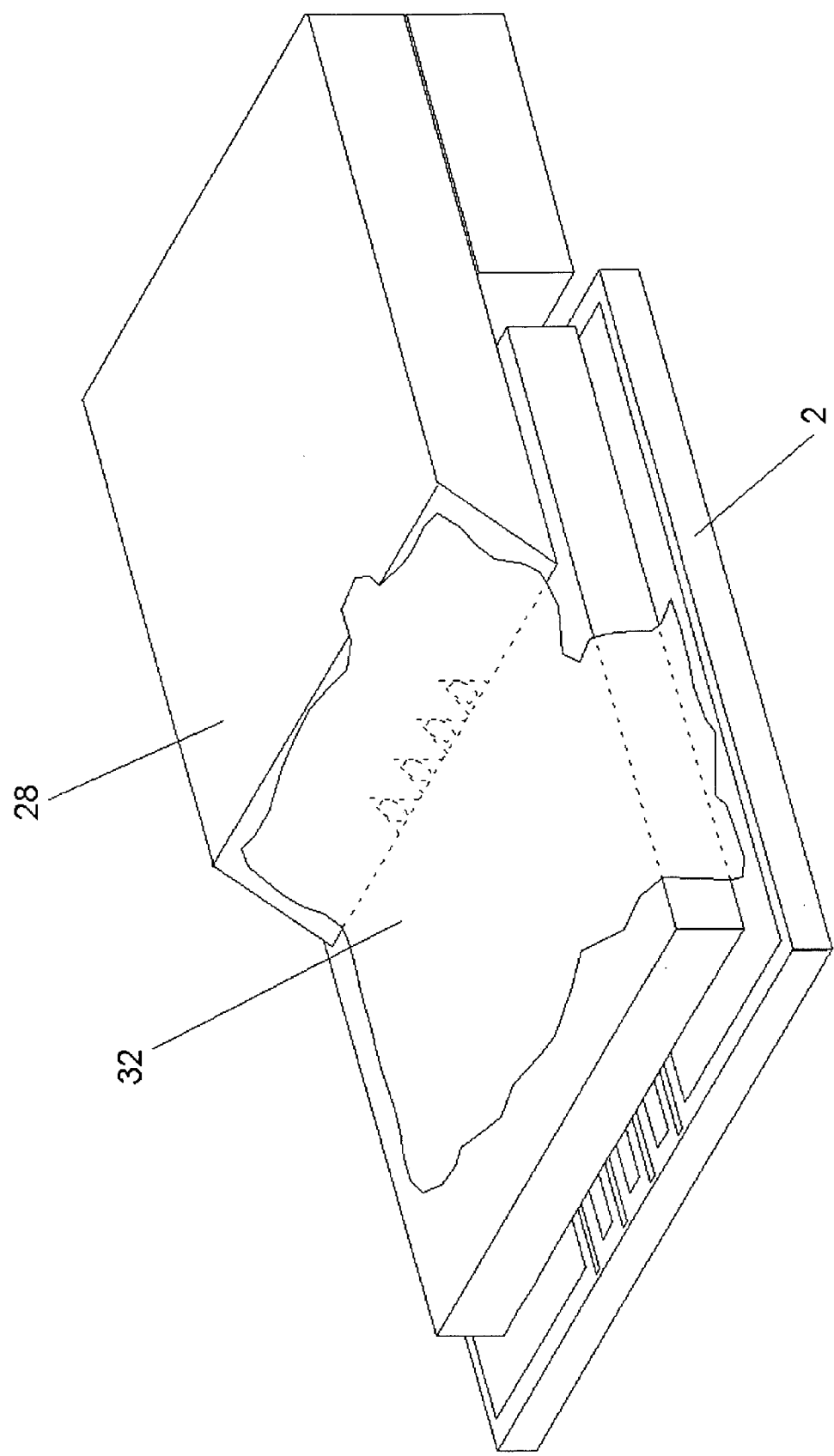
Figure 10b – Optical Ferrule and Optoelectronic Package with Gold Coating (Perspective)

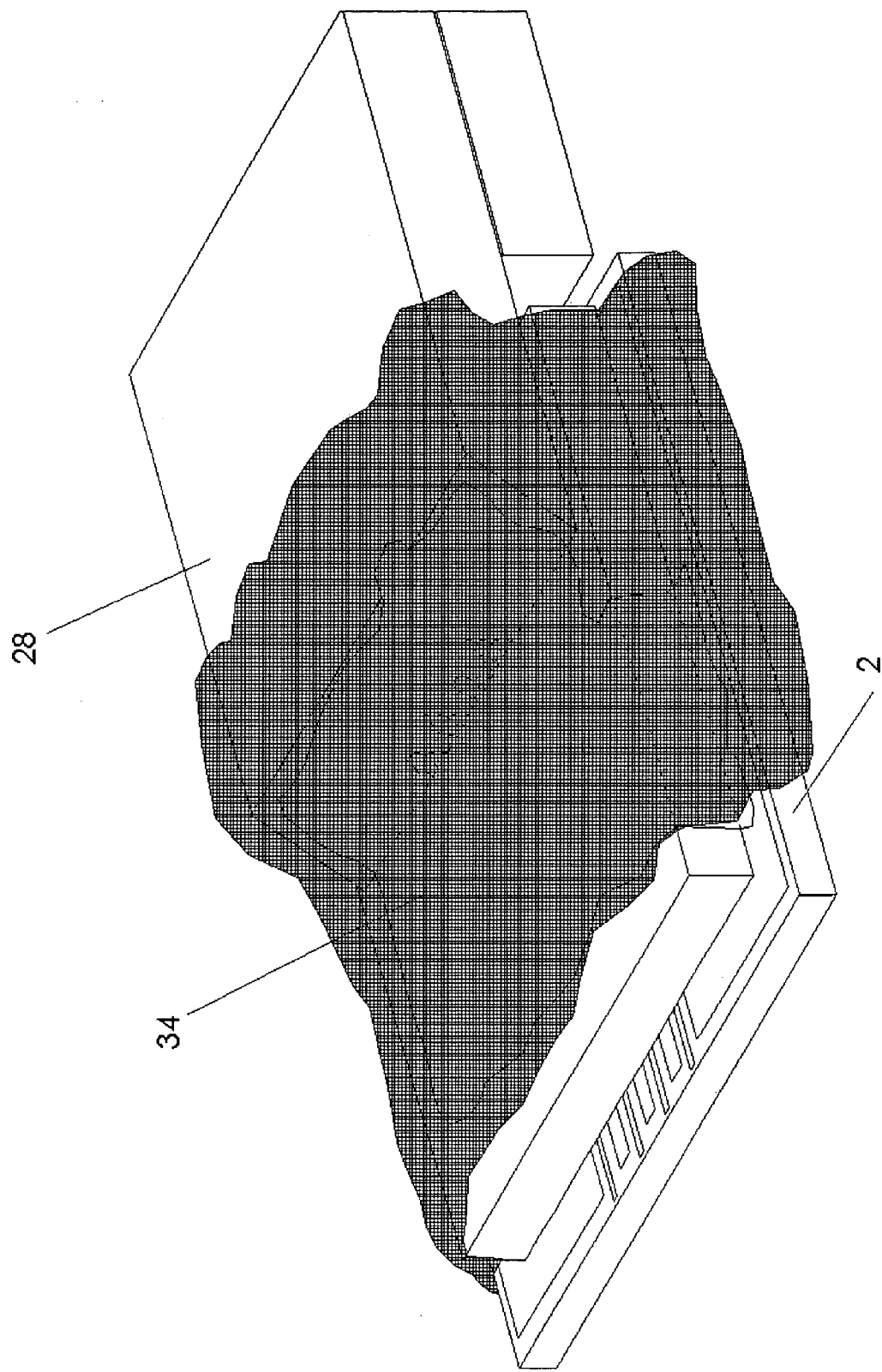
Figure 10c - Optical Ferrule, Optoelectronic Package, and Gold with Glob-Top (Perspective)

METHOD OF MANUFACTURING AN OPTOELECTRONIC PACKAGE

CROSS-REFERENCE TO RELATED APPLICATIONS

This application is related to commonly assigned co-pending applications filed herewith bearing application Ser. No. 10/625,905 titled: "Optical Connector Assembly" and Ser. No. 10/625,901 titled: "Optical Ferrule", the specifications of which are hereby incorporated by reference.

TECHNICAL FIELD

This invention relates to the field of optical packages. More precisely, this invention pertains to the field of packaging and coupling an optoelectronic chip, namely the encapsulation of optoelectronic devices and the provision for creating an optically flat and transparent window above the active region(s) of the optoelectronic device.

BACKGROUND OF THE INVENTION

Optoelectronic systems are increasing in their application to electronic equipment. High performance computers and computer network components increasingly involve conversion of computer data signals to photonic signals for transmission from one device to another, while such photonic signals require conversion to electronic data signals for use in the recipient electronic device.

Coupling optoelectronic components to waveguides remains an awkward aspect of manufacturing optoelectronic systems. Optoelectronic components are manufactured as small as possible, and therefore coupling requires precision alignment of components to waveguides. At the same time, waveguides such as optical fibers are very fragile and require secure encapsulation for mechanical stability and endurance. It is also difficult to achieve such requirements while keeping the resulting volume of a coupling as small as possible, a parameter that can be very important, if not essential, in many applications.

The encapsulation of microelectronic chips is very well known in the art and is commonly used to protect microchips in all varieties of chip packages. The method commonly used is to use a plastic resin and drop a glob of the resin over the wirebonded microchip within its package. U.S. Pat. No. 4,819,041 granted Apr. 4, 1989 and U.S. Pat. No. 5,313,365 granted May 17, 1994 both are good examples of methods used to encapsulate microchips within specific packages. These methods use types of plastic resins to fill a cavity where the microchip has been placed with (typically) opaque resin and without any consideration for the surface profile of the resin. Other examples in the prior art describe transparent epoxies such as U.S. Pat. No. 6,075,911 granted Jun. 13, 2000 and U.S. Pat. No. 6,269,209 granted Jul. 31, 2001 are examples of transparent epoxy or silicon are used with optoelectronic device and optical fibers. These patents describe how the two elements are aligned and then subsequent to the alignment how the epoxy or silicon is injected between the optoelectronic device and the optical fiber to increase coupling and provide protection.

There are several prior-art references that are still patent pending that describe encapsulation of optoelectronics. U.S. patent application Pub. No. US 2002/0001869 dated Jan. 3, 2002 describes an encapsulation technique that uses a sacrificial layer over the encapsulated optoelectronic and includes methods for placing lenses over the open window, but does not describe a polishing method to reduce the thickness of the encapsulation, nor is alignment an issue. U.S. patent application Pub. No. US 2002/0020803 dated Feb. 21, 2002 describes a method of encapsulating an entire photodetector and support electronics in an over-molded type transparent resin that includes an embedded lens that allows for light to pass through the resin to the optoelectronic device. This prior-art also does not allow for 2-D alignment and does not include polishing to create the window. Finally, U.S. patent application Pub. No. US 2002/0181899 dated Dec. 5, 2002 discusses a method for imprinting a flat, but angled surface, on a transparent epoxy resin that encapsulated an optoelectronic device. The alignment method requires dowel pin alignment and is not amenable to polishing or 2-D alignment.

SUMMARY OF THE INVENTION

It is an object of the invention to provide a method for providing an encapsulated optoelectronic device.

According to a general aspect of the present invention, there is provided an assembly that can be treated the same way as other packaged microchips (for example: the placement of packaged chips on printed circuit boards) by encapsulating the optoelectronic device to form a complete package. However, the main reason for the requirement of a flat, transparent window over the optoelectronic device package is to provide the possibility for coupling other optical devices (such as optical fibers) to the optoelectronic device. The flat, transparent window facilitates the alignment procedure used between the optoelectronic device package and a second assembly (fiber optic ferrule, lens array, laser, etc.). The second assembly can be placed on the flat surface and aligned to the optoelectronic with a maximum of 3-degrees of movement required (2-lateral and 1-rotational). This methodology is known as stackable (or 2-D) optics, and greatly simplifies the alignment procedure. A specific example of this alignment strategy involves a vertical cavity surface emitting laser (VCSEL) array chip with an array of linear parallel optical fibers. Once the VCSEL array chip has been encapsulated in a transparent resin, it has a window (or flat, transparent surface) created above the array of Lasers on the VCSEL chip. The surface is essentially co-planar with the surface of the VCSEL chip. The distance between the surface of the VCSEL chip and the flat, transparent surface is kept to a minimum, without exposing the VCSEL chip, so that a maximum amount of coupling into optical fibers is possible.

This arrangement offers several other beneficial aspects as well. The encapsulated optoelectronic device is hermetically sealed so that no moisture or contaminants can develop over the device. It is also more resilient to vibration, especially if wirebonding is used to connect to the optoelectronic device. The transparent resin can also reduce the divergence of the light emitted from the optoelectronic device (assuming a high index of refraction epoxy is used for the desired wavelength of light) and thereby allow for a longer physical distance for the same optical distance that the light can travel.

According to another aspect of the invention, there is provided a method for manufacturing an encapsulated optoelectronic package comprising an optoelectronic chip, comprising providing a substrate, securing an optoelectronic chip on the substrate, providing a translucent coating substance over the optoelectronic chip, and polishing the translucent coating substance to create planar surface over at least the optoelectronic chip, substantially parallel to the substrate, wherein the planar surface over the optoelectronic chip provides an optical coupling window.

BRIEF DESCRIPTION OF THE DRAWINGS

Further features and advantages of the present invention will become apparent from the following detailed description, taken in combination with the. appended drawings, in which:

FIGS. 1a,b are a 3D perspective view and a top view of a substrate; the substrate comprises conductive trace lines and a location for receiving an optoelectronic chip;

FIG. 1c is a 3D perspective view of a standard Ceramic-Pin Grid Array (C-PGA) carrier with an optoelectronic device and transparent epoxy deposited in the open cavity;

FIG. 1d is a 3D perspective view of a custom carrier with the optoelectronic device on a separate block and a printed circuit board adjacent to the optoelectronic device;

FIGS. 2a,b are a 3D perspective view and a top view of a substrate where an optoelectronic chip has been secured using electrically conductive epoxy;

FIGS. 3a,b are a 3D perspective view and a top view of a substrate where a bump of transparent epoxy has been placed over the secured optoelectronic chip;

FIG. 4a,b are a 3D perspective view and a top view of a substrate with a secured optoelectronic chip where the bump of epoxy has been polished over said optoelectronic chip;

FIG. 5 is a diagram which shows a geometric determination of maximum polish height;

FIGS. 6a,b a 3D perspective view and a top view of a substrate with a secured optoelectronic chip where a protection plate surrounding the optoelectronic chip has been placed;

FIGS. 7a,b are a 3D perspective view and a top view of a substrate with a secured optoelectronic chip where the protection plate surrounding the optoelectronic chip has been placed together with epoxy;

FIGS. 8a,b are a 3D perspective view and a top view of a substrate with a secured optoelectronic chip where the protection plate surrounding the optoelectronic chip has been placed together with polished epoxy; and FIGS. 9a,b are a 3D perspective view and a top view of a substrate with a secured optoelectronic chip with an optional removal of the protection plate.

FIG. 10a is a 3D perspective view of a optical ferrule over the packaged optoelectronic chip;

FIG. 10b is a 3D perspective view of a metallic layer coated over the optical ferrule and packaged optoelectronic chip;

FIG. 10c is a 3D perspective view of a plastic protection resin (glob-top) over the metal coated optical ferrule and packaged optoelectronic chip;

It will be noted that throughout the appended drawings, like features are identified by like reference numerals.

DETAILED DESCRIPTION OF THE PREFERRED EMBODIMENT

The encapsulated optical package provides a simple method of producing an optical quality flat window over the active region of an optoelectronic device. The optical window is created perpendicularly to the direction of light emission/detection of the optoelectronic device.

In the case of an array of surface-emitting lasers, such as vertical cavity surface emitting laser (VCSEL) array chip, the window is created over the chip and is co-planar with the chip.

The optical window allows a method of alignment that eliminates several undesirable degrees of mechanical freedom. The flat, co-planar window restricts alignment to 2 lateral movements and one rotational movement (X, Y AND θz). Typically, there are 6 degrees of mechanical movement (X, Y, Z, θx, θz).

Electrical trace lines that extend from the encapsulated optoelectronic device to an external electrical connection, such as bond-fingers or a press-fit connector, provide the electrical access to the optoelectronic device.

In some embodiments, the optoelectronic device is first bonded onto the substrate using an electrically and thermally conductive epoxy. The exact placement of the optoelectronic chip with respect to the substrate can be done with low positional accuracy. It is one aspect of this invention that allows the subsequent alignment of optical fibers, lenses, or other optical components to the packaged optoelectronic device to be the critical alignment step for both the lateral and rotational position. Once optical fibers, lenses, or other optical components are aligned and fixed over the packaged optoelectronic device, the far-end of the optical fibers, lenses, or other optical components becomes the optical reference surface and the electrical connections on the substrate must accommodate any positional error.

This packaging method also hermetically seals the optoelectronic chip so that it is not susceptible to humidity. Also, since the chip is encapsulated, its tolerance to mechanical vibration is greatly increased.

By encapsulating using a transparent material with a high refractive index, the divergence angle of the light-emitting device is decreased, allowing for a better coupling efficiency.

First preferred embodiment—polished transparent epoxy

As shown in FIGS. 1a and 1b, the substrate (2) is the mechanical support for the assembly. It carries all of the elements and is used to electrically access the optoelectronic chip. There are many possible configurations for the chip carrier. The first is to use off-the-shelf pin grid array (PGA) chip carriers that have an inner cavity where the optoelectronic is placed and outer connection pins which are plugged into the PCB as shown in FIG. 1c. Transparent epoxy would be placed in the inner cavity over the optoelectronic chip and then polished flat. A second version, as shown in FIGS. 1a and 1b is a more custom approach and could be based on patterning gold on an alumina substrate. A thin gold layer can typically be deposited on a flat aluminum oxide wafer or chip onto which the optoelectronic can be glued and wirebonded. As implied in the preferred embodiment, the external electrical connections to this custom-made chip carrier would allow, preferably, a second set of wirebonds from the substrate to an external PCB to take up the slack for any initial misalignment of the optoelectronic device with respect to the substrate. A third version is another custom approach that uses PCB technology and a small form connector to create the chip carrier as shown in FIG. 1d. The PCB (3) consists of trace lines (5) and a card-edge or similar electrical connection (7). The optoelectronic is placed on a metallic heat sink (9) over which the PCB is placed and bonded. The primary gain of this type of carrier is its adaptable geometry and its heat-sinking capabilities. The steps described below involving transparent epoxy and polishing could all be equally applied to any of these mentioned arrangements of chip packages.

In the following embodiment, the chip carrier will be based on the second version, as shown in FIGS. 1a,b, described above based on the gold patterned alumina substrate. The Encapsulated Optical Package consists of 5 elements. The elements are described as a substrate (or carrier package), transparent epoxy, electrically conductive epoxy, wirebonds, and an optoelectronic chip.

The custom-made alumina substrate is on the order of 1.5-cm×1.5-cm×0.2-cm in size. The top of the alumina substrate is patterned with a set of parallel gold trace lines (6) that start near the center of the substrate and end near one side of the substrate. The rest of the substrate, outside the trace lines is patterned with a continuous layer of gold (4) with alignment marks (8) for the placement of the optoelectronic chip. Preferably, the gold thickness and quality is amenable to wedge or ball wirebonding. The trace lines are used to transmit electrical signals from the perimeter of the substrate to the middle of the substrate where the chip will be placed as shown in FIGS. 2a,b.

The optoelectronic chip (10) is placed near the middle of the substrate on a portion of the gold layer, within a reasonable distance for wirebonding from the tips of the trace lines. The emitting device, such as a vertical cavity laser (12), or a detecting device, such as a photodetector, is oriented so that its direction of operation is normal to the substrate for vertical coupling of the light, although side-launched optoelectronic device may also be contemplated. The exact placement of the chip is not critical, as long as the chip can be properly wirebonded to the trace lines. The chip is epoxied in place using electrically conductive epoxy (16) and is then wirebonded to the trace lines. Preferably, the wirebonds (14) are made as flat as possible so that their peaks are no more than 30–40-microns above the surface of the chip. Since the chip is higher than the trace lines, low wirebonds will be possible. For simplicity, and for when the chip has a common cathode, or anode, on its backside, the trace lines for the common, or ground, potential may be connected directly to the area below the chip as shown in FIGS. 2a,b.

A transparent epoxy is then used that will harden using time, heat, or UV-light with a sufficiently high hardness factor so that it can be polished. Preferably, the epoxy has sufficient viscosity before being set so that it does not spread out over the surface too quickly. The following epoxies were found to be well suited to this application: Dymax (model: OP4-20632), Dexter (model: Hysol CNB753-42) and Eques (model: UV Laquer 1322 000 40045). These epoxies do not limit this application but only serve as examples of epoxies that have shown good properties in terms of wavelength, hardness, durability and moisture resistance.

The epoxy is deposited carefully over the optoelectronic chip, so not to damage the wirebonds. Preferably, the epoxy forms a somewhat convex bump (18) over the optoelectronic chip that completely encapsulates both the chip and the wirebonds, as shown in FIGS. 3a,b. Preferably, the epoxy does not cover the distant ends of the trace lines so that the chip can still be accessed electrically.

The whole package is then placed on a polishing machine so that the bump of epoxy faces the polishing paper. Preferably, standard lapping and polishing techniques are applied, including progressively finer grits of polishing paper, correct timing, appropriate slurry mixtures, and a method of holding the parts in a rigid manner. Preferably, the polishing is stopped before the wirebonds or optoelectronic chip are damaged and an optically flat window (20), that is co-planar with the surface of the optoelectronic device and chip substrate is formed. A thin, transparent layer of epoxy will remain over the chip as shown in FIGS. 4a,b.

The maximum distance above an optoelectronic chip before optical crosstalk would occur can be calculated, as shown in FIG. 5. For a light emitter such as a VCSEL, the epoxy index of refraction "$n_e$", the pitch of the light emitting devices on the optoelectronic chip "p", and the open-air full divergence angle "θ" in radians of the light source determines the maximum usable height of the epoxy above the chip:

$$\text{Max.height} = (p/2) * (1/\tan((\theta/2)/n_e)$$

For example, if p=250-microns, θ=28-degrees=0.4887-rad, and $n_e$=1.5, max. height is equal to 760.5-microns. However, distances as low as 50-microns are also desirable to couple the maximum amount of light into optical fiber.

Alternative embodiment—polished transparent epoxy with removable protection plate To aid in the process of polishing the transparent epoxy and/or to aid in containing the epoxy within a more confined volume on the substrate (2) around the chip (10), an intervening step can be performed.

The chip carrier, the chip, and the wirebonds are identical to the first preferred embodiment. However, before the transparent epoxy is placed over the chip, a frame or protection plate can be introduced. The protection plate (22) would typically have a hole or notch such that when it was placed on the chip carrier, it would surround the optoelectronic chip and the wirebonds. As shown in FIGS. 6a,b, the protection plate could be made of various materials (glass, plastic, etc.) and would offer protection to the optoelectronic chip during the polishing procedure.

The thickness of the protection plate could be chosen to be slightly higher that the optoelectronic chip and wirebonds, and be of a material that would polish less quickly than the transparent epoxy. This would help ensure that the optoelectronic chip was not damaged. Depending on the protection plate material, and the method of depositing the epoxy, the plate could be either removed, in some manner, or left in place. Preferably, the plate is also non-conductive or at least insulated from the trace lines on the substrate, and allows access to the distant ends of the trace lines for electrical access to the optoelectronic chip.

The transparent epoxy is then injected into the open hole, or notch, over the optoelectronic chip provided by the protection plate. Enough epoxy (24) is used to completely encapsulate the chip and form a rounded surface of epoxy that is higher than the protection plate as shown in FIGS. 7a,b. The epoxy is then time, heat or UV cured.

The assembly is then placed up side down on a polishing machine so that the protection plate and the epoxy face the polishing surface. The epoxy is polished until it is level with the protection plate and an optically flat window (26), that is co-planar with the chip and the substrate, is formed over the optoelectronic chip. Preferably, standard lapping and polishing techniques are applied, including progressively finer grits of polishing paper, de-ionized water, correct timing, appropriate slurry mixtures, and a method of holding the parts in a rigid manner as shown in FIGS. 8a,b.

The resulting effect is shown in FIGS. 9a,b, when the protection plate is removed.

Assembly—Complete Encapsulation Methods:

Ultimately, the encapsulated optical package must be placed into a useful support structure that allows access to the optical input or output and the electrical input or output. This requires that the encapsulated optical package be itself packaged in a second tier package (such as a transceiver housing) that may involve further encapsulation for mechanical stability and to protecting the transparent epoxy from moisture absorption or other contaminates. A standard method for sealing transparent epoxies is proposed in U.S.

Pat. No. 6,269,209 and U.S. Pat. No. 6,075,911, both use resin barriers over their transparent epoxies to eliminate moisture absorption.

Although these referenced U.S. patents may serve to protect against moisture, in the above embodiments, the use of a sufficiently moisture resistant resin or epoxy is assumed. Such epoxies were outlined above.

However, further to this patent disclosure is a method that allows for moisture resistance, electromagnetic interference protection and mechanical stability over the encapsulated optical package.

As shown in FIG. 10a, an optical ferrule (28) (related to commonly assigned co-pending application filed herewith bearing agent docket number 16005-2US titled "Optical Ferrule") has been placed over the encapsulated optical package of FIG. 8a.

As shown in FIG. 10b, the area over the transparent epoxy where the 45degree beveled optical fibers (30) exist has been coated with a metallic layer (32), preferably by selective masking and gold evaporation techniques, so that: 1) the transparent epoxy is protected from moisture, 2) the optoelectronic is electromagnetically shielded when the shield is grounded, and 3) a metallic mirror is formed over the beveled optical fibers to aid in optical reflection into the optical fiber.

Finally, the entire assembly is coated in a protective standard thermoplastic resin (34) to mechanically bond the parts within a larger assembly as shown in FIG. 10c.

The embodiments of the invention described above are intended to be exemplary only. The scope of the invention is therefore intended to be limited solely by the scope of the appended claims.

We claim:

1. A method for manufacturing an optoelectronic package comprising an optoelectronic chip, comprising:
   providing a substrate;
   securing an optoelectronic chip on said substrate;
   providing a frame on said substrate, surrounding, at least in part, the optoelectronic chip; then
   providing a translucent coating substance over the optoelectronic chip and at least a portion of said frame, further wherein the coating substance has a lower hardness than said frame; and then
   polishing the translucent coating substance to create a planar surface over at least said optoelectronic chip, substantially parallel to said substrate;
   wherein said planar surface over said optoelectronic chip provides an optical coupling window.

2. The method as claimed in claim 1, wherein the polishing of said translucent coating substance is performed using a precision machine.

3. The method as claimed in claim 1, further comprising the step of securing the optoelectronic chip on said substrate using an electrically conductive substance to provide one electrical connection between said chip and said substrate.

4. The method as claimed in claim 3, wherein the electrically conductive substance is electrically conductive epoxy.

5. The method as claimed in claim 1, further comprising the step of connecting each input pins of the provided optoelectronic chip to a trace line on said substrate.

6. The method as claimed in claim 5, wherein said connecting said input pins to said trace lines comprises using wire bonding.

7. The method as claimed in claim 5, wherein said substrate is made of ceramic.

8. The method as claimed in claim 5, further comprising a step of connecting said trace lines near a periphery of said substrate to corresponding trace lines on a printed circuit board.

9. The method as claim in claim 1, wherein the translucent coating substance is transparent epoxy.

10. The method as claimed in claim 1, wherein the translucent coating substance is applied in liquid form as a bead over said optoelectronic chip and is allowed to harden, wherein said polishing is performed in order to create a planar surface over at least said optoelectronic chip, substantially parallel to said substrate.

11. The method as claimed in claim 10, wherein the translucent coating substance encapsulates said optoelectronic chip, further comprising the step of buffing said planar surface.

12. The method as claimed in claim 11, wherein said optoelectronic chip is wirebonded to said substrate, and said translucent coating substance encapsulates wirebonds of said chip.

13. The method as claimed in claim 11, wherein the translucent coating substance is moisture-resistant transparent epoxy.

14. The method as claimed in claim 10, further comprising the step of buffing said planar surface.

15. The method as claimed in claim 1, further comprising the steps of: optically and mechanically coupling on said window one of an optical ferrule, optical component and an optoelectronic component to said optoelectronic chip; coating said package with a metallic layer to provide shielding; and coating said metallic layer with a protective material.

16. The method as claimed in claim 15, wherein an optical ferrule is coupled, said ferrule having a beveled end providing a reflective surface for at least one optical fiber of said ferrule, said metallic coating ensuring a reflective property of said beveled end.

17. The method as claimed in claim 1, wherein the frame has a predetermined thickness which is used for controlling a thickness of said optical coupling window.

* * * * *